US008901810B2

(12) United States Patent
Van Bommel et al.

(10) Patent No.: US 8,901,810 B2
(45) Date of Patent: *Dec. 2, 2014

(54) TRANSPARENT OLED DEVICE WITH HIGH INTENSITY

(71) Applicant: Koninklijke Philips Electronics N.V., Eindhoven (NL)

(72) Inventors: Ties Van Bommel, Horst (NL); Rifat Ata Mustafa Hikmet, Eindhoven (NL); Coen Adrianus Verschuren, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/782,125

(22) Filed: Mar. 1, 2013

(65) Prior Publication Data
US 2013/0175919 A1    Jul. 11, 2013

Related U.S. Application Data

(63) Continuation of application No. 13/264,009, filed as application No. PCT/IB2010/051577 on Apr. 13, 2010, now Pat. No. 8,405,300.

(30) Foreign Application Priority Data

Apr. 17, 2009    (EP) .................................... 09158160

(51) Int. Cl.
| H01L 51/50 | (2006.01) |
| H01L 25/04 | (2014.01) |
| H05B 33/14 | (2006.01) |
| H01L 51/52 | (2006.01) |

(52) U.S. Cl.
CPC ...... *H05B 33/145* (2013.01); *H01L 2251/5361* (2013.01); *H01L 25/048* (2013.01); *H01L 51/5262* (2013.01)
USPC .......................................... 313/501; 313/504

(58) Field of Classification Search
USPC .................................................. 313/501, 504
See application file for complete search history.

(56) References Cited

U.S. PATENT DOCUMENTS

| 6,693,296 B1 | 2/2004 | Tyan |
| 2005/0035706 A1 | 2/2005 | Nakayama et al. |
| 2005/0212419 A1 | 9/2005 | Vazan et al. |
| 2007/0279377 A1 | 12/2007 | Hillis et al. |
| 2008/0012478 A1 | 1/2008 | Hung et al. |
| 2008/0297045 A1 | 12/2008 | Cok |

FOREIGN PATENT DOCUMENTS

| EP | 1239518 A2 | 9/2002 |
| EP | 1385219 A2 | 1/2004 |
| JP | 2003077648 A | 3/2003 |
| WO | 2005086257 A1 | 9/2005 |

*Primary Examiner* — Mary Ellen Bowman
(74) *Attorney, Agent, or Firm* — Yuliya Mathis

(57) ABSTRACT

The present invention relates to an organic light emitting device (OLED) (100;200;400;800;900;1000;1100;1200) comprising a first substrate layer (101;201;401;501;701;1004;1104;1205) and a second substrate layer(102;202; 402;502;704; 1005;1105;1206). The device (100;200;400;800;900;1000;1100;1200) further comprises at least a first OLED assembly (103;403;503;901;1001;1101;1202) and a second OLED assembly (104;404;504;902;1002;1102;1203) arranged between the first and the second substrate layers. Each of the first and second OLED assemblies comprises a first electrically conductive layer(105;505;703), a second electrically conductive layer (106;506;706) and an organic light emitting layer (107;507;507';707) arranged between the first and the second electrically conductive layer. The organic light emitting device (100;200;400;800;900;1000;1100;1200) of the invention allows for an increased light intensity and is suitable for large area applications.

20 Claims, 6 Drawing Sheets

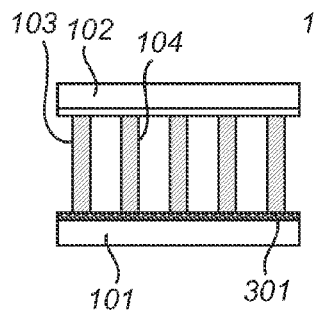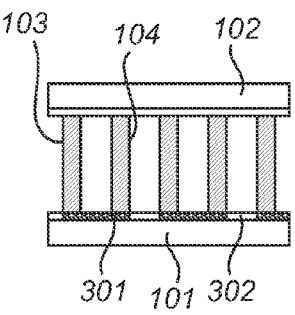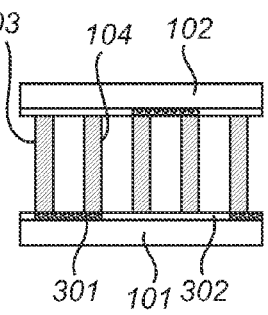
Fig. 3a   Fig. 3b   Fig. 3c
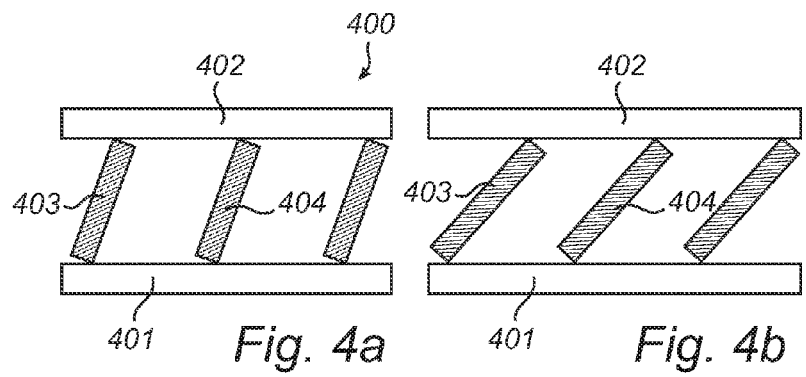
Fig. 4a   Fig. 4b
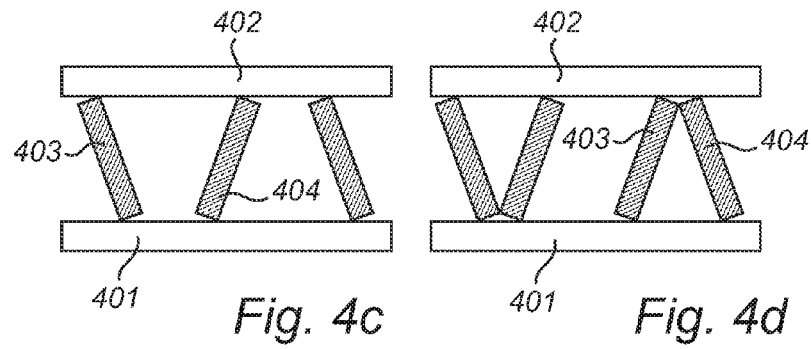
Fig. 4c   Fig. 4d

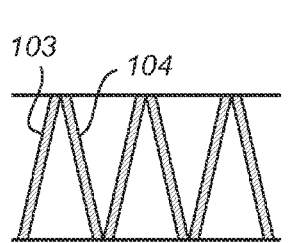 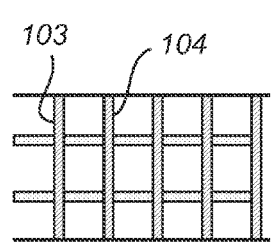 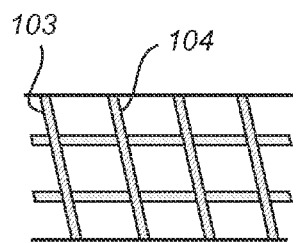
Fig. 6a  Fig. 6b  Fig. 6c
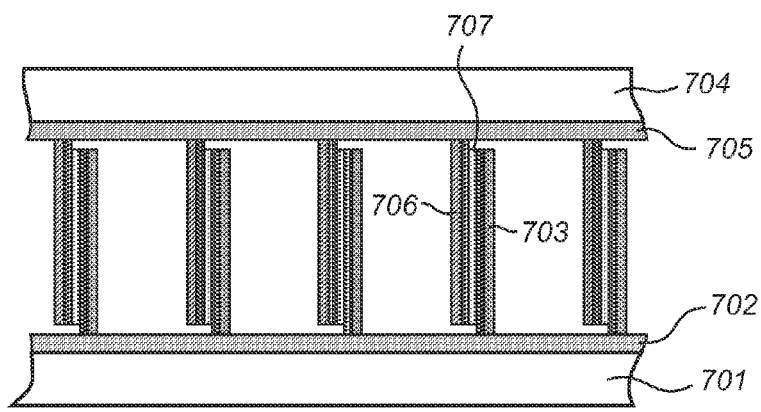
Fig. 7

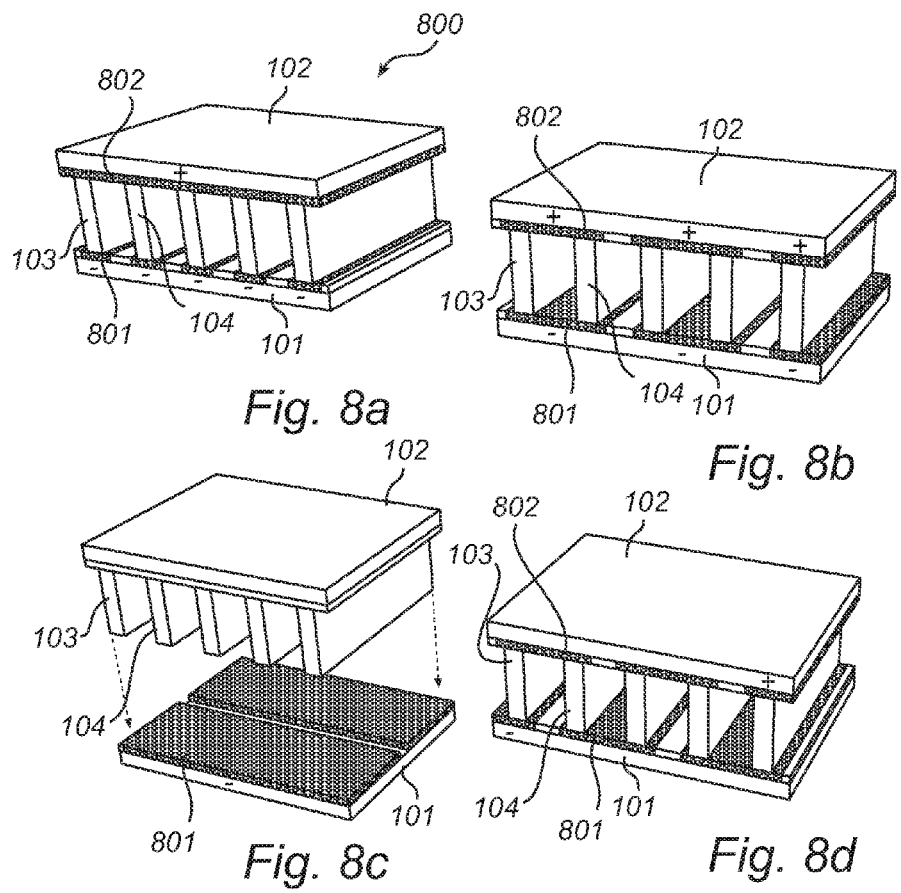
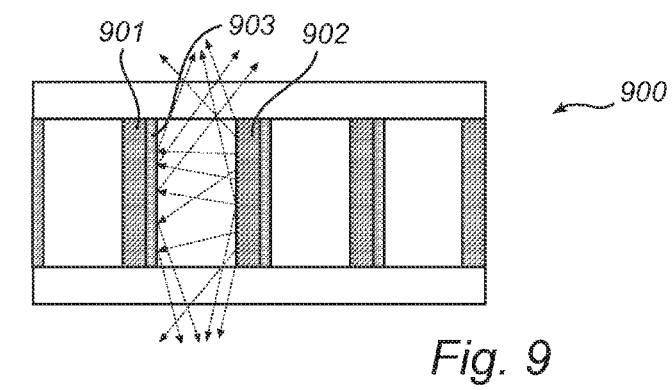

TRANSPARENT OLED DEVICE WITH HIGH INTENSITY

FIELD OF THE INVENTION

The present invention relates to an organic light emitting device (OLED).

TECHNICAL BACKGROUND

Due to their high resolution, high quality images and independence from backlight sources, organic light emitting devices (OLEDs) have attracted considerable attention in display and lighting applications.

An OLED typically comprises an anode layer, a cathode layer and an organic electroluminescent layer positioned between the anode and the cathode layers. Upon application of an electric potential, light is emitted from the device.

The intensity of light emitted by an individual OLED may be inadequate for certain applications in which higher intensity emission is required.

In order to improve the intensity of light, and hence the performance of the device, individual OLEDs may be arranged in stacks.

Such an arrangement is e.g. disclosed in U.S. Pat. No. 6,693,296, wherein an OLED apparatus comprising a substrate and a plurality of OLED devices is disclosed. Each of the plurality of OLED devices includes at least one organic layer extending over an edge of a corresponding spaced apart bottom electrode.

One problem associated with the OLED apparatus of U.S. Pat. No. 6,693,296 is that excess absorption of light may occur within the stack due to the high absorbance of the electrodes. As a result, the overall light intensity may be reduced.

Accordingly, there is a need in the art to provide an OLED device which provides for an enhanced light intensity of the emitted light, especially for use in large-area applications.

SUMMARY OF THE INVENTION

An object of the present invention is to at least partly overcome the above-mentioned problems and to address the need in the art.

Especially, it is an object of the present invention to provide an organic light emitting device which allows for an increased light intensity.

According to one aspect, the invention relates to an organic light emitting device (OLED) comprising a first substrate layer and a second substrate layer. The device further comprises at least a first OLED assembly and a second OLED assembly arranged between the first and the second substrate layers. Each of the first and second OLED assemblies comprises a first electrically conductive layer, a second electrically conductive layer and an organic light emitting layer arranged between the first and the second electrically conductive layer. Each of the first and second OLED assemblies is arranged to form a non-zero angle in relation to at least one of the first and the second substrate layers.

The present invention is based upon the realization that such a device allows for a higher density of light emitting structures, and hence an improved light intensity per unit surface area since several OLED assemblies may be arranged in parallel to form a non-zero angle to the substrate layers.

Furthermore, in this arrangement the disadvantages associated with vertically stacked OLEDs are avoided, such as the absorption of light within the stack.

Light emitted from at least one of the OLED assemblies is emitted either through the first substrate layer or the second substrate layer, or both. Hence, at least one of the first and the second substrate layers may be transparent.

Accordingly, light may be emitted from either a single surface of from several surfaces, thereby enhancing the total light intensity of the OLED device. It is also possible to obtain various ratios of light emission from different surfaces.

Furthermore, the angle between the OLED assemblies and the substrate(s) determines the density of OLED assemblies that can be achieved in the OLED device. The density can be expressed as a ratio between the length of the OLED assemblies and the distance between adjacent OLED assemblies. This ratio may advantageously be greater than 1, and more advantageously range between 2 and 5.

Moreover, by selecting a suitably large angle between the substrate and the OLED-assemblies it is possible to achieve an OLED device combining a high output intensity with a high transparency. This makes it possible to look through the device in the on-state without being blinded by the high light intensity. Alternatively, such an arrangement allows light from external sources, such as daylight to enter only under controlled directions, while being able to emit a controlled amount of light in other controlled directions.

To this end, each of the first and the second OLED assemblies may be arranged to form an angle which is greater than 30° in relation to at least one of the first and the second substrate layers.

The substrate layers are typically arranged in parallel, and by varying the angle between the OLED assemblies and the substrate layers, the direction of the emitted light may be adjusted. Accordingly, the light emission can be directed and controlled.

Preferably, each of the first and the second OLED assemblies may be arranged to form an angle of 90° in relation to at least one of the first and the second substrate layers.

This allows for an increased light intensity per unit surface area since several OLED assemblies may be arranged in parallel.

Thus, the light emitting layers of the first and the second OLED assemblies, respectively, are typically arranged to face each other and light may be emitted parallel to the light emitting layers.

This allows for multiple light emitting structures; i.e. OLED assemblies to be arranged between the substrate layers, and the light intensity of the output light is thus improved.

In embodiments, at least one of the first and the second substrate layers may be electrically conductive.

The substrate layer may itself be electrically conductive or it may be provided with an electrode or an electrically conductive film.

Typically, the first substrate layer may be provided with a first electrode which is in electrical contact with the first electrically conductive layer and the second substrate layer may be provided with a second electrode which is in electrical contact with the second electrically conductive layer.

Accordingly, at least one anode and at least one cathode are formed on the substrate layers.

In embodiments, at least one of the first and the second electrodes may be patterned.

This allows for connecting multiple OLED assemblies in series such that the overall performance of the device is improved. Furthermore, this allows for one or more of the individual OLED assemblies to be addressed separately.

In alternative embodiments of the present invention, the device may further comprise at least one diffusive layer arranged to diffuse at least part of the light emitted by the light emitting layer.

The diffusive layer diffuses the light emitted by the light emitting layer, and the light output from the first and/or the second substrate layer is thereby improved. As a result, the output light will be homogenous and diffuse.

The device may further comprise at least one light redirecting structure arranged to redirect at least part of the light emitted by the light emitting layer in a direction towards the first or the second substrate layers.

The light redirecting structure allows for an increased redistribution of and an enhanced light output from at least one of the substrate layers.

In order to provide for the output of light having a desirable wavelength distribution, the organic light emitting device of the invention may further comprise a wavelength converting element arranged between the first OLED assembly and the second OLED assembly.

The wavelength converting element may be arranged between, and spaced apart from, the OLED assemblies allowing for a so called "remote phosphor" application. This arrangement allows for the light quality (unpleasant peak brightness, colour control) to be improved and the colour may be controlled by varying the properties of the wavelength converting material(s). Furthermore, the use of a wavelength converting element that is not directly attached to the light source alleviates the requirements with respect to temperature and light flux that the wavelength converting material can withstand.

In embodiments, the device may further comprise a light guide arranged to guide at least part of the light emitted by the first or the second OLED assemblies into the wavelength converting element.

The light guide serves to guide the light to the wavelength converting element and to capture and recycle light from the wavelength converting element(s).

An organic light emitting device of the present invention may be used in e.g. decorative lighting, shop lighting and lighting for atmosphere creation and is suitable for large area applications.

These and other aspects of the invention will be apparent from and elucidated with reference to the embodiment(s) described hereinafter.

BRIEF DESCRIPTION OF THE DRAWINGS

FIGS. 3a-c show examples of an organic light emitting device according to embodiments of the invention, wherein at least part of at least one substrate layer is reflective.

FIGS. 4a-d illustrate various configurations of the OLED assemblies of an organic light emitting device of the invention.

FIGS. 6a-c show top-views of exemplary OLED assembly configurations of embodiments of the present invention.

FIG. 7 illustrates an embodiment of the invention, wherein the first and the second electrically conductive layers are in electrical contact with the first and the second electrically conductive layers, respectively.

FIGS. 8a-d illustrate exemplary embodiments of the invention, wherein at least one of the first and said second substrate layers is patterned.

FIG. 9 illustrates an embodiment of an organic light emitting device of invention comprising at least one diffusive layer.

DESCRIPTION OF A PREFERRED
EMBODIMENT OF THE PRESENT INVENTION

Figure 1:
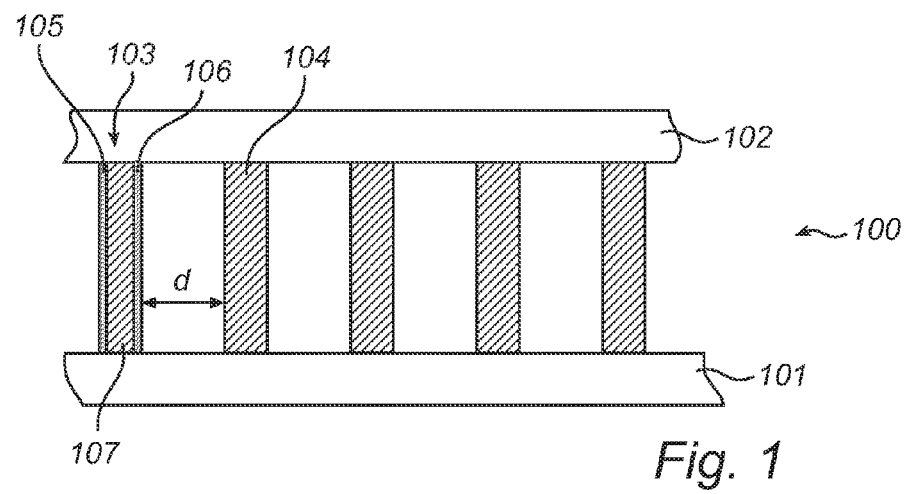
FIG. 1 is a vertical sectional view of an organic light emitting device according to one embodiment of the present invention.

One embodiment of an organic light emitting device 100 according to the present invention is illustrated in FIG. 1, and comprises a first substrate layer 101 and a second substrate layer 102. The device further comprises at least a first OLED assembly 103 and a second 104 OLED assembly arranged between the first 101 and the second 102 substrate layers. Each of the first 103 and second 104 OLED assemblies comprises a first electrically conductive layer 105, a second electrically conductive layer 106 and an organic light emitting layer 107 arranged between the first 105 and the second 106 electrically conductive layers.

In FIG. 1, the first 105 and second 106 electrically conductive layers and organic light emitting layer 107 are shown only for the first OLED assembly 103, although the second OLED assembly 104 has the same structure.

Each of the first 103 and the second 104 OLED assemblies is arranged to form a non-zero angle in relation to at least one of the first 101 and the second 102 substrate layers, respectively.

Here, the OLED assemblies 103 and 104 are arranged perpendicular to the substrate layers 101 and 102.

When a voltage is applied, current starts flowing through the device 100. Current flows from the first electrically conductive layer 105 to the second electrically conductive layer 106. Accordingly, negatively charged electrons move from the second electrically conductive layer 106 into the light emitting layer 107. At the same time, positive charges, typically referred to as holes, move from the first electrically conductive layer 105 into the light emitting layer 107. When the positive and negative charges meet, they recombine and produce photons (light).

In this embodiment, the first electrically conductive layer 105 serves as an anode layer, and the second electrically conductive layer 106 serves as a cathode layer. However, the first electrically conductive layer 105 may serve as the cathode, and the second electrically conductive layer 106 as the anode.

At least one of the electrically conductive layers 105 and 106 is transparent to the photons generated, and light will be emitted from one OLED assembly towards another.

Typically, the first and the second OLED assemblies may be arranged at a distance d from each other. This distance may be varied depending on the application and desired light effect to be achieved.

Light emitted from at least one of the OLED assemblies 103 and 104 is mixed in the region defined between the OLEDs and is emitted either through the first substrate layer 101 or the second substrate layer 102, or both.

Hence, at least one of the first and the second substrate layers 101 and 102 may be transparent, i.e. comprise a material with a good optical transmittance.

Accordingly, light may be emitted from either a single surface or from several surfaces, thereby enhancing the total light intensity of the OLED device. It is also possible to obtain various ratios of light emission from different surfaces.

Figure 2:
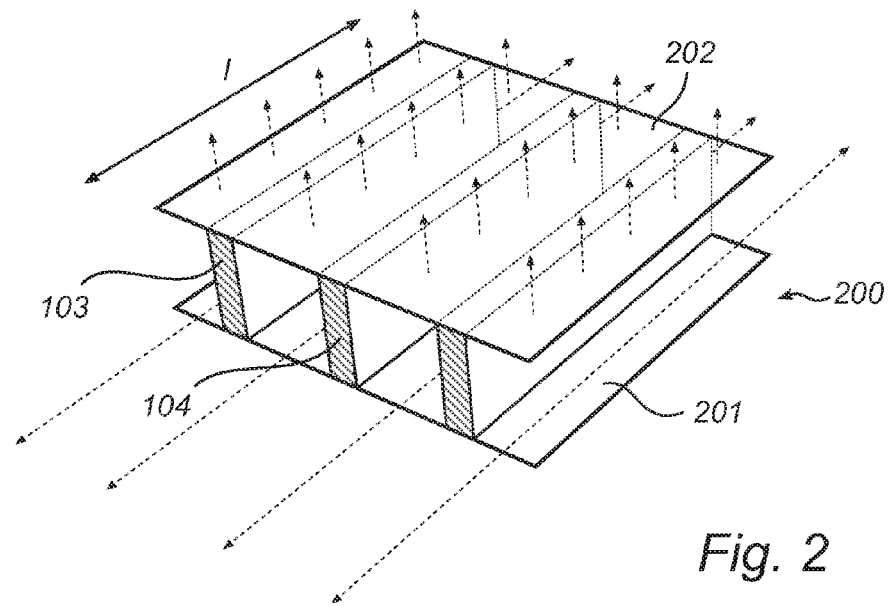
FIG. 2 is a top-view of the organic light emitting device in FIG. 1.

As is illustrated in FIG. 2, in a device 200 of the invention, light may be emitted from both the first 201 and the second 202 substrate layers as well as in a lateral direction; i.e. a direction perpendicular to the light emitted from the substrate layers 201 and 202.

The length of the substrate layers 201 and 202, and hence the length, l, of the OLED device 200 depends on the desired application and may be in the range of from 10 cm up to a few meters.

The length of the OLED assembly; i.e. the distance between the first 201 and the second 202 substrate layers may be in the range of from 1 to 20 cm, e.g. 5 to 15 cm.

The ratio of the OLED assembly length to the distance, d, between the individual OLED assemblies is typically above 1, e.g. from 2 to 5. The ratio of the OLED 110 assembly length to the distance, d, is important in determining the intensity of the light as well as determining the angular range of light transmitted through such an assembly.

At least a part of at least one of the first and said second substrate layers 101 and 102 may be reflective, as is illustrated in FIG. 3.

This allows for the light emission to be directed and controlled depending on the desired light effect and application.

In situations where a less transparent high intensity light emitting device is desired, the second substrate layer 102 may be transparent; and the first substrate layer 101 may be provided with a reflective material 301, which is still partly transparent, e.g. 50% transmissive or reflective in a specific part of the visible range (FIG. 3a). This way, the light emission from the device is optimized in one direction.

In embodiments, the second substrate layer 102 may be transparent and the first substrate layer 101 may comprise reflective parts 301 and transmissive parts 302 (FIG. 3b). Alternatively, the first and second substrate layers 101 and 102 may comprise reflective parts 301 and transmissive parts 302 (FIG. 3c).

Accordingly, the light emission may be directed and varied depending on the application and desired transparency.

As mentioned, the first and the second OLED assemblies should be arranged to form a non-zero angle in relation to at least one of the first and the second substrate layers.

Typically, each of the first and the second OLED assemblies may be arranged to form an angle which is larger than 30° in relation to at least one of the first and the second substrate layers. Such an arrangement is illustrated in FIG. 4, where the OLED assemblies 403 and 404 are non-perpendicularly aligned to the substrate layers 401 and 402.

In this arrangement, the direction of the emitted light may be adjusted with respect to the substrate layer(s). Furthermore, the transmission angle with respect to the substrate layers 401 and 402 may be controlled.

For example, if the maximum emission angle from the device is substantially different from the maximum transmission angle, one may look through the device in the on-state without getting blinded by the high light intensity. Alternatively, such an arrangement allows light from external sources, such as daylight to enter only under controlled directions, while being able to emit a controlled amount of light in other controlled directions. Accordingly, both external light sources and device related light sources are effectively integrated.

In preferred embodiments, illustrated in FIG. 5, the OLED assemblies 503 and 504 are arranged to form an angle of 90° in relation to the substrate layers 501 and 502.

Accordingly, the light emitting layers 507 and 507' of the first OLED 503, and the second OLED 504, respectively, are arranged to face each other and light will be emitted parallel to the light emitting layer 507.

In such embodiments, it is possible to stack several OLED assemblies perpendicular to the substrate layers, and achieve a higher light intensity per unit area.

Figure 5A:
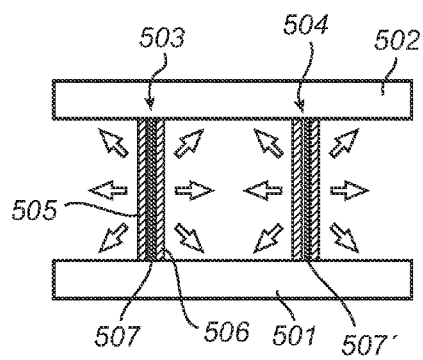
FIG. 5a-f illustrate alternative embodiments of the invention, wherein the light emission from each of the OLED assemblies are directed in different directions.
Figure 5B:
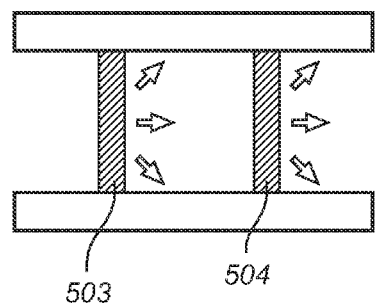

The light emission from the OLED assemblies 503 and 504 may be controlled and directed in different directions. For example, both the first and the second electrically conductive layers 505 and 506 may be transparent to the light generated (FIG. 5a).

Figure 5C:
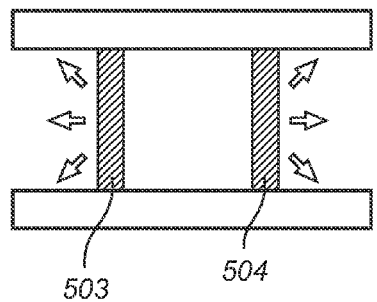

Alternatively, only one of the first and the second electrically conductive layers 505 and 506 may be arranged to emit light, i.e. the OLED assemblies 503 and 504 are single side emitting elements. Thus, light may be emitted in the same direction (FIG. 5b) or in opposite directions (FIG. 5c). Hence, only one of the electrically conductive layers 505 and 506 is transparent to the light generated.

Figure 5D:
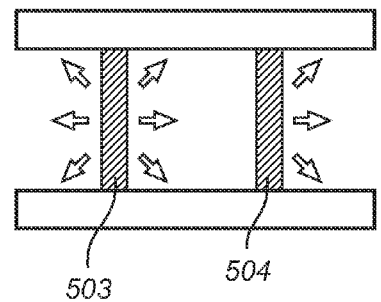

In embodiments, both a completely transparent OLED assembly 503 (comprising transparent electrically conductive layers) and a single side emitting OLED assembly 504 may be used (FIG. 5d).

Figure 5E:
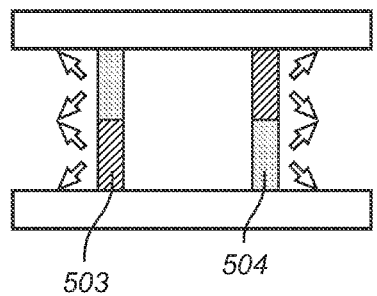

Alternatively, as is illustrated in FIG. 5e multi-coloured emitting OLED assemblies 503 and 504 may be used. Various colour effects may thus be achieved.

Figure 5F:
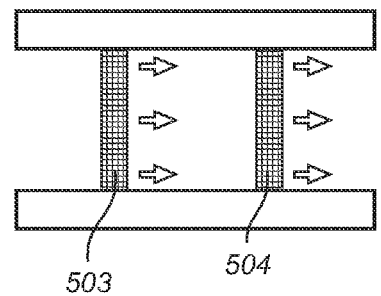

Furthermore, it is possible to use pixelated OLED devices 503 and 504 in order to display information such as text, pictures or even movies (FIG. 5f).

FIG. 6 illustrates a top-view of exemplary configurations of the OLED assemblies arranged perpendicularly to the substrate layer (FIG. 6b) and non-perpendicularly (FIGS. 6a and c).

Typically, at least one of the first and the second substrate layers is electrically conductive.

Accordingly, one of the substrate layers may itself be electrically conductive or may be provided with an electrode, e.g. an electrically conductive film.

According to one exemplary embodiment, as shown in FIG. 7, the first substrate layer 701 is provided with a first electrode 702 which is in electrical contact with the first electrically conductive layer 703 and the second substrate layer 704 is provided with a second electrode 705 which is in electrical contact with the second electrically conductive layer 706.

Examples of electrode materials (or substrate materials when the substrate itself is electrically conductive) include e.g. indium tin oxide (ITO), tin oxide (e.g. doped with fluor or antimony), zinc oxide (e.g. doped with aluminium), polyethylenedioxythiophene (PEDOT), indium zinc oxide, stacks of several electrically conductive metals. A number of materials and combinations of materials may be used and these are known to those skilled in the art.

Accordingly, the substrate layers 701 and 704 form at least one anode and at least one cathode.

In embodiments, anodes and cathodes may be alternated on each substrate layer such that consecutive devices may be connected in series. Thus, much lower currents need to be transported over the substrate contact lines.

In embodiments of the invention, illustrated in FIG. 8, at least one of the first and the second electrodes 801 and 802 is patterned.

Either one of the electrodes may be patterned (FIG. 8a) such that each OLED assembly may be adressed separately, or both electrodes may be patterned (FIG. 8b). In the latter case, more than one OLED assembly may be adressed separately. Alternatively, the first substrate layer is covered with both an an anode and a cathode (FIG. 8c).

In FIG. 8d, the electrodes are patterned in such a way that the OLEDs are connected in series.

The OLED assemblies may be driven with either DC or AC current.

Referring now to FIG. 9, an exemplary embodiment of a light emitting device 900 according to the invention is illustrated.

In this embodiment the device 900 comprises at least one diffusive layer 903 arranged to diffuse at least part of the light emitted by the light emitting layer.

Such a diffusive layer 903 may be arranged on the first 901 or the second 902 OLED assemblies, or on both.

The diffusive layer 903 diffuses the light emitted by the light emitting layer, and serves to increase the light extraction such that the emission of light parallel to the light emitting layer is enhanced.

The diffusive layer 903 may also comprise a reflective material which serves to redirect the light emitted in angles non-parallel to the light emitting layer.

A diffusive layer 903 may be arranged to receive light from the first electrically conductive layer of the OLED assembly 901, or alternatively from the second electrically conductive layer.

Figure 10:
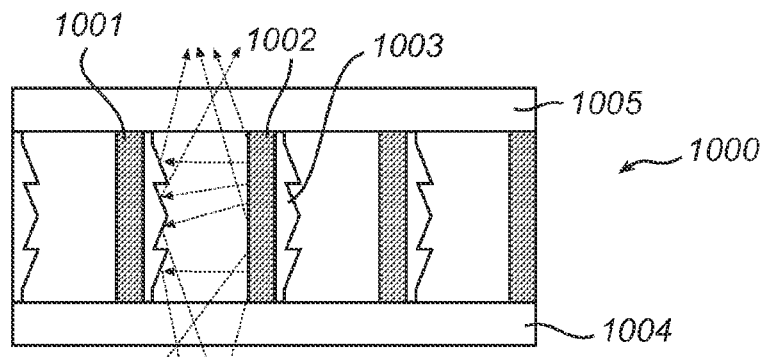
FIG. 10 illustrates an embodiment of an organic light emitting device of the invention comprising at least one reflective layer.

In embodiments, the device 1000 comprises at least one light redirecting structure arranged to redirect at least part of the light emitted by the light emitting layer in a direction towards the first or the second substrate layers 1004 and 1005 (FIG. 10).

The redirecting structure may be a reflective layer 1003. Such a reflective layer 1003 may be diffuse reflective, specular reflective or angle dependent reflective. For example the reflective layer 1003 may comprise surface relief patterns; i.e. have a segmented reflective structure as is illustrated in FIG. 10.

The reflective layer 1003 allows for an increased redistribution of light and an enhanced light output from at least one of the substrate layers 1004 and 1005.

Figure 11:
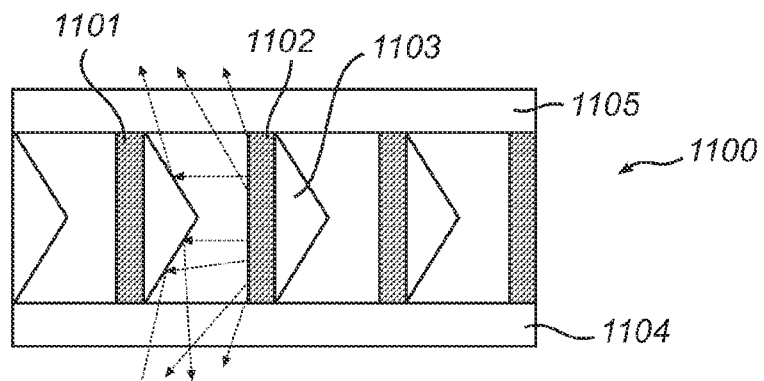
FIG. 11 illustrates an embodiment of an organic light emitting device of the invention comprising at least one beam splitter.
Figure 12:
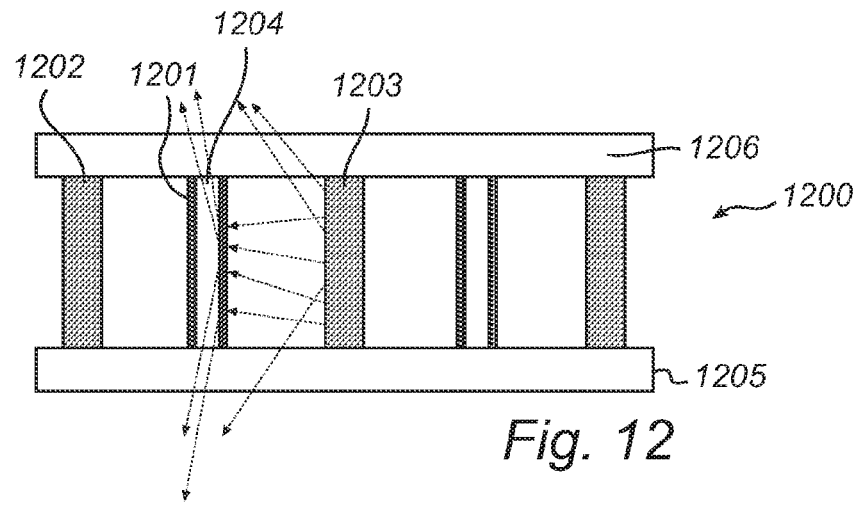
FIG. 12 illustrates another embodiment of the invention, wherein the organic light emitting device comprises a wavelength converting element and a light guide.

Instead of, or in addition to, a reflective layer, the device may comprise a beam splitter 1103 (FIG. 11) which serves the same function as the reflective layer; i.e. to redirect the light and enhance the light output from the substrate layers 1104 and 1105.

In order to enhance the decorative light effects and to provide for the output of light having a desirable wavelength distribution, the organic light emitting device 1200 of the invention may further comprise at least one wavelength converting element 1201 arranged between the first OLED assembly 1202 and the second OLED assembly 1203.

As used herein the term "wavelength converting element" refers to an element that absorbs light of a first wavelength resulting in the emission of light of a second, longer wavelength. Upon absorption of light, electrons in the material become excited to a higher energy level. Upon relaxation back from the higher energy levels, the excess energy is released from the material in form of light having a longer wavelength than of that absorbed. Hence, the term relates to both fluorescent and phosphorescent wavelength conversion.

The wavelength converting element 1201 is arranged between, and typically spaced apart from, the OLED assemblies 1201 and 1202 allowing for a so called "remote phosphor" application. In traditional light emitting devices, the wavelength converting material, i.e. the phosphor is embedded in glue that is directly attached to the light source or the LED chip. The use of wavelength converting material that is not directly attached to the light source alleviates the requirements with respect to temperature and light flux that the wavelength converting material can withstand. Therefore, this so-called remote phosphor embodiment allows for a low colour temperature and a good colour rendering index. Furthermore, the light quality (unpleasant peak brightness, colour control) may be improved and the colour may be controlled by varying the properties of the wavelength converting material(s). Furthermore, a luminaire manufacturer can choose the colour independently of the LED(s).

In embodiments, the device 1200 further comprises a light guide 1204 arranged to guide at least part of the light emitted by the first or the second OLED assemblies 1202 and 1203 into the wavelength converting element 1203.

The light guide 1204 also serves to guide the light from the wavelength converting element 1201 and concentrate it to the edges of the element 1201. This allows for an increased intensity of light emitted from the substrate layers 1205 and 1206.

The organic light emitting device of the present invention may further comprise additional optical components. Such additional components may e.g. be diffusive or reflective layers arranged on top of at least one of the substrate layers; i.e. arranged on the light output surface of the substrate layer(s). Such additional components may be used to enhance the decorative light effect.

In addition to the various configurations described above it is also possible to place additional transparent OLED assemblies at the bottom and even at the sides of the stack in order to increase the intensity and obtain various decorative effects.

An organic light emitting device according to the invention may be used in several applications, e.g. decorative lighting, shop lighting and lighting for atmosphere creation.

In another aspect, the present invention relates to a light sensor device comprising an organic light emitting device as described hereinbefore.

Such a light sensor device may comprise a control unit, a light sensor an organic light emitting device of the invention. The control unit can be adapted to perform at least one measurement using the light sensor and to control the intensity of the light emitted by the individual OLED elements based on the at least one measurement.

The light sensor may either be positioned within the organic light emitting device or outside as an external device connected to the device via a connector, such as a connecting wire.

It is also possible to connect other type of sensing means to the device of the invention, e.g. to measure the presence and/or actions of people in an environment and adapt the lighting according to the actions measured.

It is also possible to control the light emitted by the individual ED assemblies based on the day or time.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. For example, depending on the OLED assemblies, OLED element configuration, additional optical components and substrate layers used, various organic light emitting devices may be obtained. The invention is not limited to a specific organic light emitting composition or a specific wavelength converting material.

The invention claimed is:

1. A device, comprising:
   a first substrate layer and a second substrate layer, at least one of said first and said second substrate layers being electrically conductive; and
   at least a first organic light emitting device (OLED) assembly and a second OLED assembly arranged between said first and said second substrate layers,
   wherein each of said first and second OLED assemblies comprises a first electrically conductive layer, a second electrically conductive layer and an organic light emitting layer arranged between said first and said second electrically conductive layers, wherein the first electrically conductive layer, the organic light emitting layer, and the second electrically conductive layer are stacked upon each in a stack direction and each of the first and second OLED assemblies extends from the first substrate layer to the second substrate layer in a height direction which is perpendicular to the stack direction, and
   wherein each of said first and said second OLED assemblies is arranged such that its height direction forms a non-zero angle in relation to at least one of said first and said second substrate layers.

2. The device of claim 1, wherein at least one of said first and said second substrate layers is transparent.

3. The device of claim 1 wherein each of said first and said second OLED assemblies is arranged such that its height direction forms an angle of at least 30 degrees in relation to at least one of said first and said second substrate layers.

4. The device of claim 3, wherein each of said first and said second OLED assembly is arranged such that its height direction forms an angle of 90 degrees in relation to at least one of said first and said second substrate layers.

5. The device of claim 1, wherein said first substrate layer is provided with a first electrode in electrical contact with said first electrically conductive layer and wherein said second substrate layer is provided with a second electrode which is in electrical contact with said second electrically conductive layer.

6. The device of claim 5, wherein at least one of said first and said second electrodes is patterned.

7. The device of claim 1, further comprising at least one diffusive layer arranged to diffuse at least part of the light emitted by said light emitting layer.

8. The device of claim 1, further comprising at least one light redirecting structure arranged to redirect at least part of the light emitted by said light emitting layer in a direction towards said first or said second substrate layer.

9. The device of claim 1, further comprising a wavelength converting element arranged between said first OLED assembly and said second OLED assembly.

10. The device of claim 9, further comprising a light guide arranged to guide at least part of the light emitted by said first or said second OLED assembly into said wavelength converting element.

11. A device, comprising:
    a first substrate layer having a principal surface, and a second substrate layer having a principal surface, wherein the first and second substrate layers are separated and spaced apart from each other such that the principal surfaces thereof face each other, at least one of said first and said second substrate layers being electrically conductive;
    a first organic light emitting (OLED) assembly comprising a first electrically conductive layer, a first organic light emitting layer, and a second electrically conductive layer stacked upon each other in a first stack direction, the first OLED assembly being disposed between the first and said second substrate layers such that the first stack direction is not perpendicular to at least one of: the principal surface of the first substrate layer and the principal surface of the second substrate layer; and
    a second OLED assembly comprising a third electrically conductive layer, a second organic light emitting layer, and a fourth electrically conductive layer stacked upon each other in a second stack direction, the second OLED assembly being disposed between the first and said second substrate layers such that the second stack direction is not perpendicular to at least one of: the principal surface of the first substrate layer and the principal surface of the second substrate layer.

12. The device of claim 11, wherein at least the first substrate layer is transparent.

13. The device of claim 11, wherein the first and second substrate layers each include a transparent portion and a reflective portion.

14. The device of claim 11, wherein the principal surface of each of the first and second substrate layers has a length L and wherein a distance between the first OLED assembly and the second OLED assembly is D, and wherein $2 \leq L/D \leq 5$.

15. The device of claim 11, wherein the first stack direction and the second stack direction are each parallel to the principal surface of the first substrate layer and the principal surface of the second substrate layer.

16. The device of claim 11, wherein at least one of the first and said OLED assemblies comprises a plurality of pixels.

17. The device of claim 11, wherein the first and second organic light emitting layers are disposed in parallel to each other, and the first organic light emitting layer emits light in a direction perpendicular to the first stack direction and toward the second organic light emitting layer.

18. The device of claim 11, further comprising at least one of a diffusive layer and a light redirecting structure arranged to redirect at least part of the light emitted by the first light emitting layer towards at least one of the first and second substrate layers.

19. The device of claim 11, wherein the first and second organic light emitting layers are disposed in parallel to each other, and the first organic light emitting layer emits light in a direction perpendicular to the first stack direction and away from the second organic light emitting layer.

20. The device of claim 11, further comprising at least one of a diffusive layer and a light redirecting structure arranged to redirect at least part of the light emitted by the first light emitting layer towards at least one of the first and second substrate layers.

* * * * *